United States Patent
Zhao et al.

(10) Patent No.: US 8,928,139 B2
(45) Date of Patent: Jan. 6, 2015

(54) DEVICE HAVING WIRELESSLY ENABLED FUNCTIONAL BLOCKS

(75) Inventors: Sam Ziqun Zhao, Irvine, CA (US); Michael Boers, Irvine, CA (US); Ahmadreza Rofougaran, Newport Coast, CA (US); Arya Behzad, Poway, CA (US); Jesus Castaneda, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/249,885

(22) Filed: Sep. 30, 2011

(65) Prior Publication Data

US 2013/0082363 A1    Apr. 4, 2013

(51) Int. Cl.
| | |
|---|---|
| H01L 23/34 | (2006.01) |
| H01L 23/552 | (2006.01) |
| H05K 1/00 | (2006.01) |
| H01L 23/498 | (2006.01) |
| H01L 23/48 | (2006.01) |

(52) U.S. Cl.
CPC ............... *H05K 1/00* (2013.01); *H01L 23/552* (2013.01); *H01L 2223/6677* (2013.01); *H01L 23/49805* (2013.01); *H01L 2224/16225* (2013.01); *H01L 2924/14* (2013.01); *H01L 23/48* (2013.01); *H01L 2924/15311* (2013.01); *H01L 2224/73204* (2013.01)
USPC .................................. 257/728; 257/E23.144

(58) Field of Classification Search
CPC ........................................................ H01L 23/66
USPC .......................................... 257/728, E23.114
See application file for complete search history.

(56) References Cited

U.S. PATENT DOCUMENTS

| | | | |
|---|---|---|---|
| 5,629,838 A | 5/1997 | Knight et al. | |
| 5,877,547 A | 3/1999 | Rhelimi | |
| 5,898,909 A | 4/1999 | Yoshihara et al. | |
| 6,249,242 B1 | 6/2001 | Sekine et al. | |
| 6,476,330 B2 | 11/2002 | Otsuka et al. | |
| 6,670,692 B1 | 12/2003 | Chiu et al. | |
| 6,916,719 B1 * | 7/2005 | Knight et al. | 438/381 |

(Continued)

FOREIGN PATENT DOCUMENTS

| | | |
|---|---|---|
| CN | 101095261 A | 12/2007 |
| CN | 101212232 A | 7/2008 |

(Continued)

OTHER PUBLICATIONS

Chang et al., "RF-Interconnect for Future Inter- and Intra-ULSI Communications," International Electron Devices Meeting 2001, Technical Digest, pp. 537-540, Dec. 2, 2001.

(Continued)

*Primary Examiner* — Matthew Reames
(74) *Attorney, Agent, or Firm* — Sterne, Kessler, Goldstein & Fox PLLC

(57) ABSTRACT

Embodiments described herein provide enhanced integrated circuit (IC) devices. In an embodiment, an IC device includes a substrate, an IC die coupled to a surface of the substrate, a first wirelessly enabled functional block located, on the IC die, the first wirelessly enabled functional block being configured to wirelessly communicate with a second wirelessly enabled functional block located on the substrate, and a ground ring configured to provide electromagnetic shielding for the first and second wirelessly enabled functional blocks.

20 Claims, 7 Drawing Sheets

(56) References Cited

U.S. PATENT DOCUMENTS

| | | |
|---|---|---|
| 6,942,157 B2 | 9/2005 | Nozawa et al. |
| 7,405,477 B1 * | 7/2008 | Tao et al. .................. 257/728 |
| 7,479,841 B2 | 1/2009 | Stenger |
| 7,525,199 B1 | 4/2009 | Lauterbach et al. |
| 7,671,806 B2 | 3/2010 | Voigtlaender |
| 7,997,501 B2 | 8/2011 | Ikemoto et al. |
| 8,290,446 B2 | 10/2012 | Rofougaran |
| 2002/0179721 A1 | 12/2002 | Elbaz et al. |
| 2003/0100200 A1 | 5/2003 | Franzon et al. |
| 2004/0100781 A1 | 5/2004 | Bozso et al. |
| 2005/0075080 A1 | 4/2005 | Zhang |
| 2005/0225481 A1 | 10/2005 | Bonthron |
| 2006/0176851 A1 | 8/2006 | Bennett et al. |
| 2006/0285480 A1 | 12/2006 | Janofsky |
| 2007/0065984 A1 | 3/2007 | Lau et al. |
| 2007/0235864 A1 | 10/2007 | Megahed |
| 2007/0267725 A1 | 11/2007 | Lee et al. |
| 2007/0298730 A1 | 12/2007 | Tandy |
| 2008/0122726 A1 | 5/2008 | Levi et al. |
| 2008/0159243 A1 | 7/2008 | Rofougaran |
| 2008/0181252 A1 | 7/2008 | Rofougaran |
| 2008/0237843 A1 | 10/2008 | Gupta et al. |
| 2008/0252543 A1 | 10/2008 | Pettus |
| 2008/0274712 A1 | 11/2008 | Rofougaran |
| 2008/0315375 A1 | 12/2008 | Eichelberger et al. |
| 2008/0316106 A1 | 12/2008 | Voigtlaender |
| 2008/0316126 A1 | 12/2008 | Voigtlander |
| 2008/0317402 A1 | 12/2008 | Kodama et al. |
| 2009/0002972 A1 * | 1/2009 | Carey et al. ................. 361/818 |
| 2009/0006675 A1 | 1/2009 | Rofougaran |
| 2009/0072843 A1 | 3/2009 | Slupsky et al. |
| 2009/0075428 A1 * | 3/2009 | Tang et al. .................. 438/114 |
| 2009/0125746 A1 | 5/2009 | Rofougaran |
| 2009/0153427 A1 | 6/2009 | Rofougaran |
| 2009/0227205 A1 | 9/2009 | Rofougaran |
| 2009/0262290 A1 | 10/2009 | Sampica et al. |
| 2009/0266900 A1 | 10/2009 | Ikemoto et al. |
| 2009/0278760 A1 | 11/2009 | Kimura et al. |
| 2009/0289343 A1 | 11/2009 | Shih et al. |
| 2009/0315797 A1 | 12/2009 | Rofougaran et al. |
| 2009/0318105 A1 | 12/2009 | Rofougaran et al. |
| 2010/0035370 A1 | 2/2010 | Ding et al. |
| 2010/0060478 A1 | 3/2010 | Joe |
| 2010/0141536 A1 | 6/2010 | Zhang et al. |
| 2010/0219513 A1 | 9/2010 | Zhang et al. |
| 2011/0024889 A1 | 2/2011 | Hata |
| 2011/0316139 A1 | 12/2011 | Zhao et al. |
| 2012/0086114 A1 | 4/2012 | Zhao et al. |
| 2012/0212244 A1 | 8/2012 | Zhao et al. |
| 2013/0082363 A1 | 4/2013 | Zhao et al. |

FOREIGN PATENT DOCUMENTS

| | | |
|---|---|---|
| CN | 203071061 U | 7/2013 |
| EP | 0 887 861 A1 | 12/1998 |
| EP | 0 932 200 A2 | 7/1999 |
| EP | 2 012 258 A1 | 1/2009 |
| JP | 2008-251768 A | 10/2008 |
| KR | 10-2009-0096526 | 9/2009 |
| WO | WO 2008/065640 | 6/2008 |

OTHER PUBLICATIONS

Office Action mailed Jul. 31, 2012, in U.S. Appl. No. 13/022,277, Zhao et al., filed Feb. 7, 2011.
Office Action mailed Jan. 22, 2013, in U.S. Appl. No. 13/022,277, Zhao et al., filed Feb. 7, 2011.
Office Action mailed Jul. 22, 2013, in U.S. Appl. No. 13/022,277, Zhao et al., filed Feb. 7, 2011.
Office Action mailed Aug. 6, 2012, in U.S. Appl. No. 13/022,291, Zhao et al., filed Feb. 7, 2011.
Office Action mailed Jan. 16, 2013, in U.S. Appl. No. 13/022,291, Zhao et al., filed Feb. 7, 2011.
Office Action mailed Jul. 19, 2013, in U.S. Appl. No. Zhao et al., filed Feb. 7, 2011.
Office Action mailed Oct. 8, 2013, in U.S. Appl. No. 13/149,315, Zhao et al., filed May 31, 2011.
English language abstract for EP 0 887 861 A1, published Dec. 30, 1998, provided by Espacenet, 2 pages.
English language abstract for JP 2008-251768 A, published Oct. 16, 2008, provided by Espacenet, 2 pages.
English language abstract for KR 10-2009-0096526, published Sep. 10, 2009, provided by Espacenet, 2 pages.
European Search Report, dated Jul. 25, 2013, for European Appl. No. 11005016.8, 8 pages.
European Search Report, dated Apr. 17, 2013, for European Appl. No. 11008016.3, 8 pages.
European Search Report, dated Feb. 4, 2013, for European Appl. No. 12005675.9, 5 pages.
Office Action mailed Dec. 22, 2011, in U.S. Appl. No. 13/022,277, Zhao et al., filed Feb. 7, 2011.
Office Action mailed Dec. 22, 2011, U.S. Appl. No. 13/022,291, Zhao et al., filed Feb. 7, 2011.
Co-pending Application, U.S. Appl. No. 13/149,315, inventors Zhao et al., filed May 31, 2011 (Not Published).
Co-pending Application, U.S. Appl. No. 13/022,291, inventors Zhao et al., filed Feb. 7, 2011 (Not Published).
Office Action for Related Chinese Patent Application No. 2011101710023, mailed May 27, 2013; 10 pages.
Communication from the Examining Division of the European Patent Office directed to related European Patent Application No. 11 008 116.3, Munich, Germany, mailed Aug. 21, 2013; 7 pages.
Communication from the Examining Division of the European Patent Office directed to related European Patent Application No. 12 005 675.9, Munich, Germany, mailed Sep. 3, 2013; 4 pages.
Non-Final Office Action for U.S. Appl. No. 13/022,291, mailed Feb. 25, 2014; 26 pages.
Final Office Action for U.S. Appl. No. 13/022,277, mailed Feb. 27, 2014; 28 pages.
Notice of Allowance for U.S. Appl. No. 13/149,315, mailed Mar. 28, 2014; 7 pages.
Chinese Office Action from the State Intellectual Property Office of the P.R.C. (SIPO), directed toward related Chinese Application No. 201210365294.9, dated Oct. 30, 2014; 7 pages.

* cited by examiner

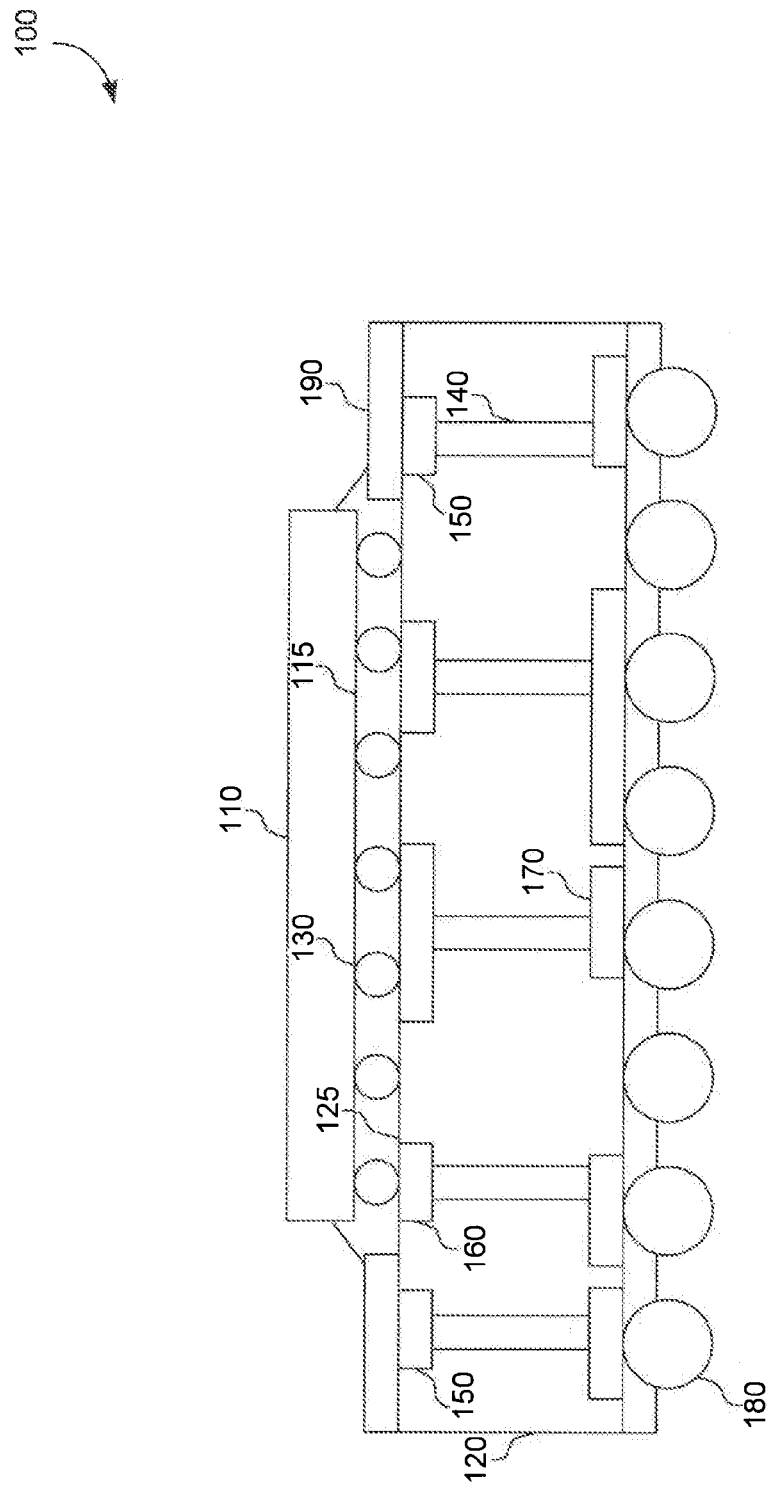
FIG. 1
Conventional

DEVICE HAVING WIRELESSLY ENABLED FUNCTIONAL BLOCKS

BACKGROUND

1. Field

The present invention generally relates to integrated circuit (IC) devices, and more particularly to communications involving IC devices.

2. Background Art

Integrated circuit (IC) devices typically include an IC die housed in a package. The IC device can be coupled to a printed circuit board (PCB) to enable communication between the IC device and other devices coupled to the PCB. For example, in array-type packages, an IC die is often coupled to a substrate, which is coupled to an array of connection elements, e.g., an array of solder balls. The array of connections elements is then physically coupled to the PCB.

An IC die can be coupled to a substrate in a variety of ways. For example, in die down flip-chip packages, solder bumps can be used to couple contact pads on a surface of the IC die to contact pads located on the substrate. In another example, wirebonds can be used to couple bond pads on a surface of the IC die to bond fingers located on the substrate.

Conventional ways of coupling an IC die to a substrate can, however, be costly. For example, the materials used to create wirebonds, e.g., gold, can be expensive, thus increasing the cost of the entire device. Furthermore, the conventional ways of coupling the IC die to the substrate can also be susceptible to manufacturing defects. For example, wirebonds and/or solder bumps can break or be damaged during the manufacturing and assembly processes, reducing the throughput for the IC device.

Furthermore, conventional ways of coupling different IC devices can also have drawbacks. For example, when IC devices are coupled together using a PCB, the elements used to couple the IC devices to the PCB can break or be damaged during manufacturing or field application. Additionally, almost all communications within an IC device or between the IC device and other devices (e.g., through a PCB) are susceptible to electromagnetic interference. The presence of this interference can compromise the fidelity of communications, and thus significantly hamper the performance of the overall system.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 is a cross-sectional view of a conventional die down ball grid array package.

Figure 2:
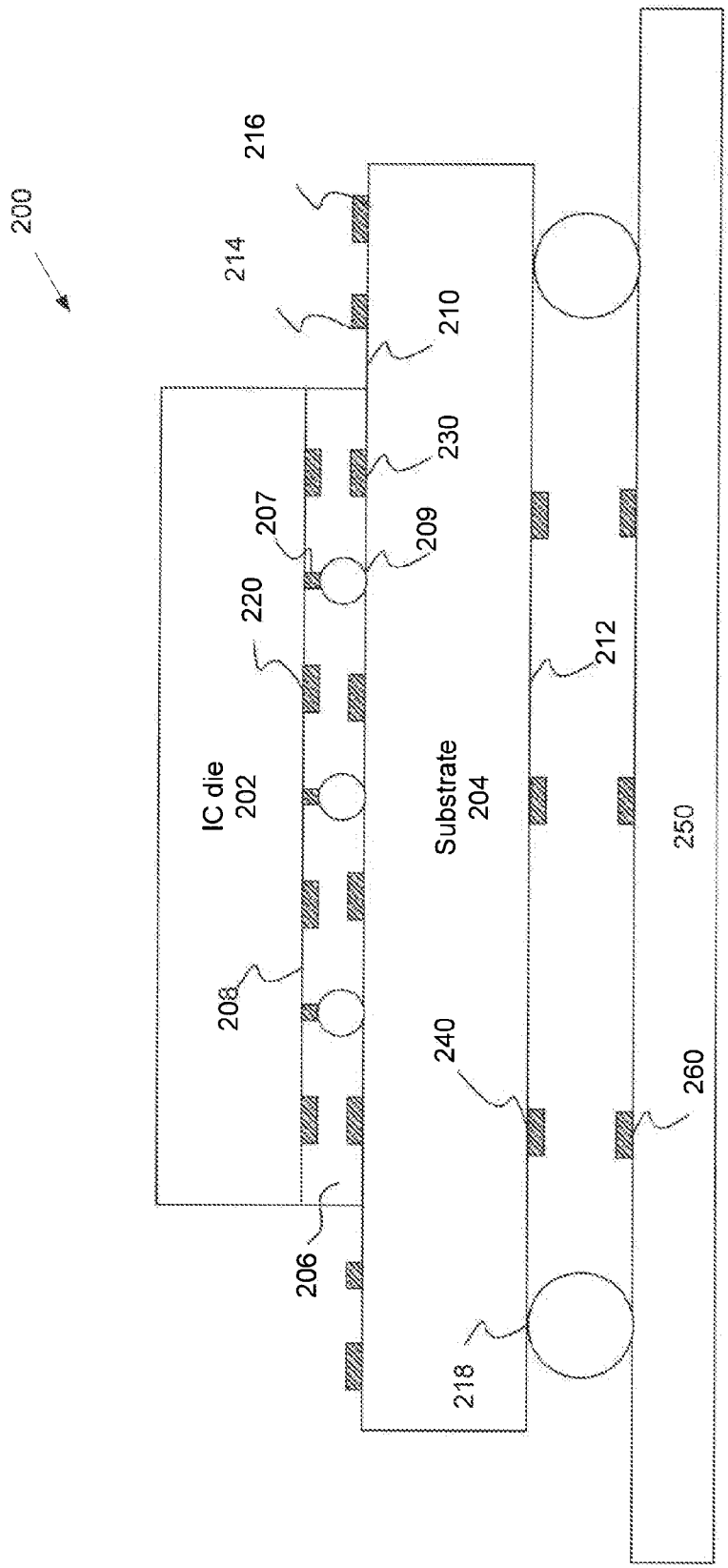
FIG. 2 is a cross-sectional view of an IC device having a ground ring located on a substrate, according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

Conventional Packages

FIG. 1 shows a cross-sectional view of a conventional die down ball grid array (BGA) package 100. BGA package 100 includes an IC die 110 coupled to a top surface 125 of a substrate 120 via solder bumps 130. BGA package 100 is a die down package in which an active surface 115 of die 110 faces substrate 120. On the other hand, in die up packages, the active surface of the die faces away from the substrate.

Active surface 115 often includes power and ground distribution rails and input/output contact pads. A plurality of solder bumps 130 can be distributed across active surface 115 of flip chip die 110 to respectively connect flip chip die 110 to substrate 120. As shown in FIG. 1, a solder mask 190 surrounds the area where solder bumps 130 are located.

In the conventional arrangement shown in FIG. 1, vias 140 connect solder bumps 130, traces, and/or via pads 150 at top surface 125 of substrate 120 to solder balls 180 at a bottom surface of substrate 120. As shown in FIG. 1, substrate 120 can include bump pads 160 and ball pads 170. Bump pads 160 are connected to solder bumps 130 at top surface 125 of substrate 120. Ball pads 170 are connected to solder balls 180 at the bottom surface of substrate 120. Solder balls 1.80 can electrically connect flip chip BGA package 100 to any suitable surface having electrically conductive connections, such as a PCB.

Exemplary Embodiments of the Invention

In embodiments described herein, IC devices are provided that include wirelessly enabled functional blocks. The wirelessly enabled functional blocks can be used to communicate signals between an IC die and a substrate. Additionally or alternatively, wirelessly enabled functional blocks can be used to communicate signals between the substrate and a printed circuit board (PCB). In an embodiment, a ground ring can also he provided that provides electromagnetic shielding for the wirelessly enabled functional blocks. Because the wireless communications between wirelessly enabled functional blocks are especially susceptible to electromagnetic interference, the ground ring providing for fidelity of communication between the wirelessly enabled functional blocks can be especially useful.

FIG. 2 shows a cross-sectional. diagram of an IC device 200 coupled to a printed circuit board (PCB) 250, according to an embodiment of the present invention. IC device 200 includes an IC die 202 coupled to a substrate 204 through an adhesive 206. IC die 202 has a first plurality of wirelessly enabled functional blocks 220 and contact pads 207 formed on a surface 208. Substrate 204 has a second and third pluralities of wirelessly enabled functional blocks 230 and 240 formed on surfaces 210 and 212, respectively. Substrate 204 also has solder bumps 209 and solder balls 211 formed on surfaces 210 and 212, respectively. PCB 250 has a fourth plurality of wirelessly enabled functional blocks 260 and solder balls 218 formed thereon. First and second ground rings 214 and 216 are formed on surface 210 of substrate 204.

Adhesive 206 attaches IC die 202 to substrate 204. In an embodiment, adhesive 206 is an electrically non-conductive epoxy.

As shown in FIG. 2, IC die 202 is both ohmically and wirelessly coupled to substrate 204. In particular, contact pads 207 of IC die 202 are physically coupled to solder bumps 209 of substrate 204. Moreover, ones of first plurality of wirelessly enabled functional blocks 220 are configured to wirelessly communicate with respective ones of second plurality of wirelessly enabled functional blocks 230. Similarly, substrate 204 is both ohmically and wirelessly coupled to PCB 250. In particular, surface 212 of substrate 204 is physically connected to solder bails 218 through which substrate 204 is coupled to PCB 250. Additionally, ones of third plurality of wirelessly enabled functional blocks 240 are configured to wirelessly communicate with respective ones of fourth plurality of wirelessly enabled functional blocks 260 located on PCB 250. In an embodiment, multiple access techniques such as FDMA, TDMA, or CDMA can be used by the wirelessly enabled functional blocks so that different ones of first, second, third, and fourth pluralities of wirelessly enabled functional blocks 220, 230, 240, and 260 do not interfere with each other. The structure of first, second, third, and fourth pluralities of wirelessly enabled functional blocks 220, 230, 240, and 260 will be described in greater detail with respect to FIG. 3 below.

Like all communications between IC die 202, substrate 204, and PCB 250, communications between first, second, third, and fourth pluralities of wirelessly enabled functional blocks 220, 230, 240, and 260 are susceptible to electromagnetic interference originating outside of IC device 200. The communications between first, second, third, and fourth pluralities of wirelessly enabled functional blocks 220, 230, 240, and 260, however, are especially susceptible to interference because these communications occur wirelessly. As such, electromagnetic interference can seriously jeopardize the fidelity of the communications between the different pluralities of wirelessly enabled functional blocks.

To reduce the electromagnetic interference, ground rings 214 and 216 are provided in IC device 200, shown in FIG. 2. Ground rings 214 and 216 can be formed as metal traces on surface 210 of substrate 204 and can be coupled to ground potential through substrate 204, e.g., through a ground plane of substrate 204. In an embodiment, ground rings 214 and 216 can be formed out of conductive metals such as copper, gold, a nickel-gold alloy, silver, or other metal. In operation, ground rings 214 and 216 act as Faraday cages that prevent electromagnetic waves from entering the spaces between one or more of first, second, third, and fourth pluralities of wirelessly enabled functional blocks 220, 230, 240, and 260. Moreover, ground rings 214 and 216 can also be used as a common ground for the components of IC device 200. For example, ground rings 214 and 216 can be used as a common ground for ones of first, second, third, and fourth pluralities of wirelessly enabled functional blocks 220, 230, 240, and 260.

In an embodiment, ground rings 214 and 216 can be configured to be flexible. For example, ground rings 214 and 216 can be formed to be relatively thin, e.g., about the same or less than the thickness of typical traces formed on substrate 204 and can be made out of flexible or malleable materials, such as a metal. In doing so, ground rings 214 and 216 do not exert additional stress on substrate 204 when IC device 200 is bent or otherwise stressed, thus reducing the likelihood that substrate 204 will break or otherwise be damaged.

As shown in FIG. 2, IC device 200 includes two ground rings, namely ground rings 214 and 216. As would be apparent to those skilled in the relevant arts based on the description herein, IC device 200 can include any number of ground rings similar to ground rings 214 and 216 (e.g., one, three, or more than three) without departing from the scope and spirit of the present invention.

Figure 3:
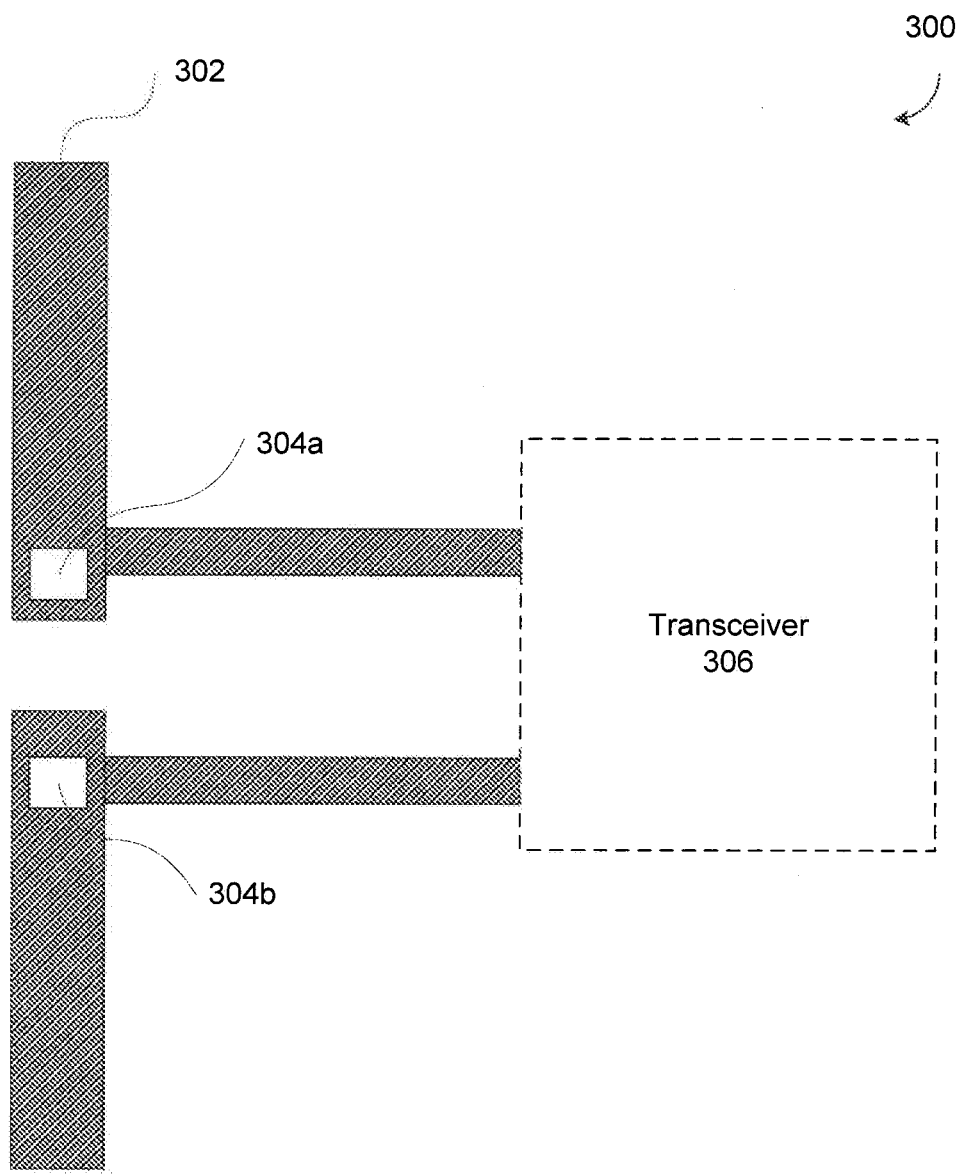
FIG. 3 is a diagram of a wirelessly enabled functional block, according to an embodiment of the invention.

FIG. 3 shows diagram of a wirelessly enabled functional block 300, according to an embodiment of the present invention. Wirelessly enabled functional block 200 includes an antenna 302 and vias 304a and 304b (collectively "304"), which feed antenna 302. One or more of first, second, third, and fourth pluralities of wirelessly enabled functional blocks 220, 230, 240, and 260 can be implemented in a manner substantially similar to wirelessly enabled functional block 300. In an embodiment, at least one of vias 304 is a through silicon via (e.g., in the embodiment in which wirelessly enabled functional block 300 is formed on surface 208 of IC die 202).

As shown in FIG. 3, antenna 302 is a dipole antenna. Other antenna configurations can be used as appropriate. In an embodiment, antenna 302 can be formed out of metal traces or planes. For example, dipole antenna 302 can be formed using traces on IC die 202 or substrate 204. Antenna 302 can be configured to operate in a certain frequency range (e.g., by adjusting the dimensions of antenna 302). In other embodiments, antenna 302 can be another type of antenna. For example, antenna 302 can be a patch antenna having a square or rectangular shape.

Vias 304 can be used to drive antenna with or received from antenna a single ended signal or a differential signal. For example, via 304a can be coupled to a signal plane (e.g., a ground plane through one or more of ground rings 214 and 216) and via 304b can be coupled to a circuit block or other element that provides a single-ended signal. Alternatively, each of vias 304 can be coupled to circuit blocks or other elements that provide components of a differential signal.

As shown in FIG. 3, wirelessly enabled functional block 300 optionally includes a transceiver 306. In such an embodiment, antenna 302 is fed by transceiver 306. Transceiver 306 can be coupled to a signal plane using vias of a die, a substrate, or a PCB. In an embodiment, transceiver 306 is also coupled to a circuit block or a portion of a PCB (e.g., through a substrate). Transceiver 306 can be configured to transmit signals received from the circuit block or the PCB and/or convey received signals to the circuit block or the PCB. In a further embodiment, transceiver 306 can have additional functionality. For example, transceiver 306 may be capable of performing signal processing tasks such as modulation and demodulation and to allow for the use of the multiple access noted above.

Figure 4:
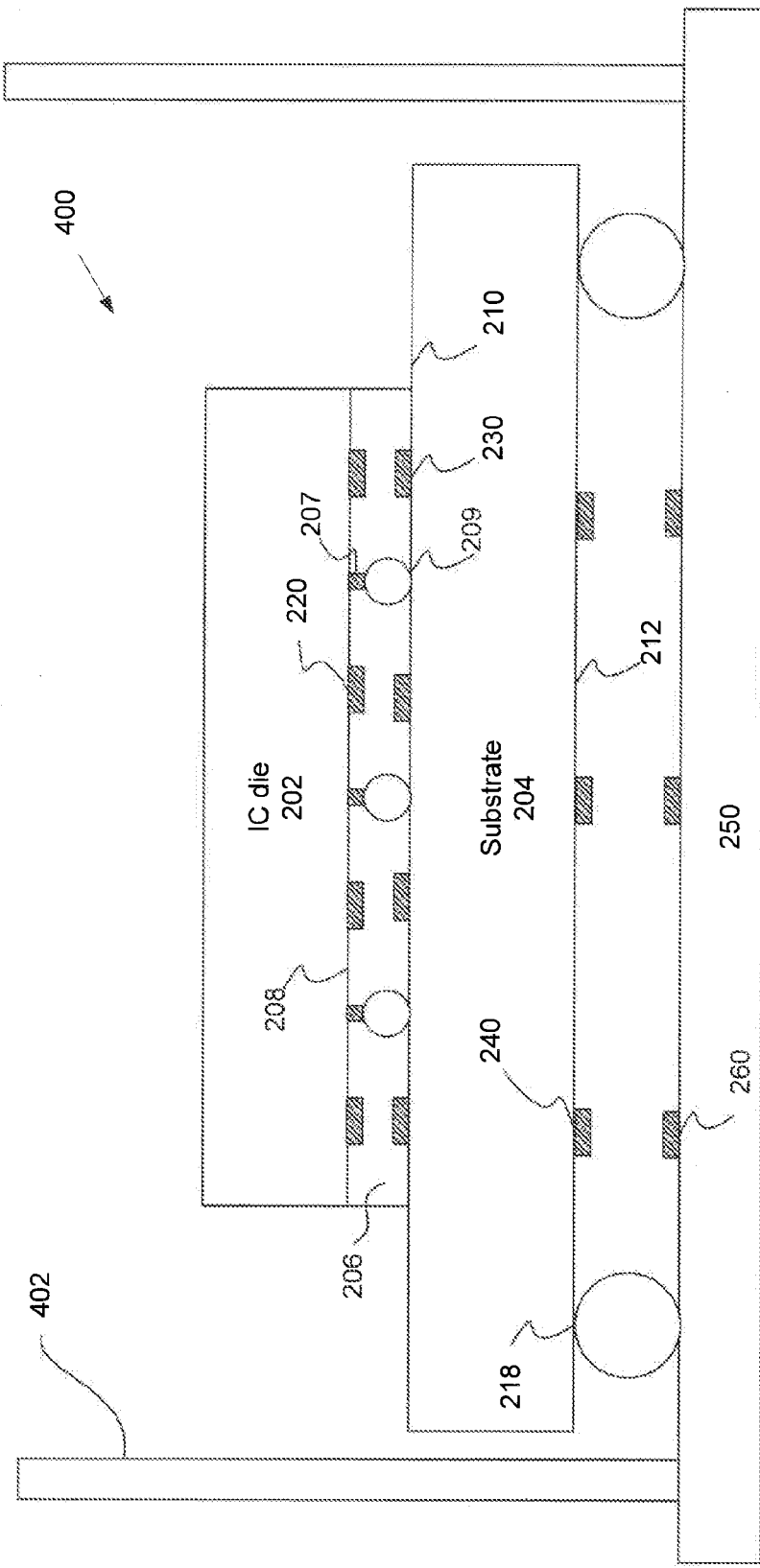
FIGS. 4-6 are cross-sectional diagrams of IC devices having a ground ring coupled to a printed circuit board, according to embodiments of the present invention.

FIG. 4 shows a cross-sectional diagram of an IC device 400 coupled to PCB 250, according to an embodiment of the present invention. IC device 400 is substantially similar to IC device 200, except that IC device 400 does not include ground rings 214 and 216. Instead, a ground ring 402 is provided on PCB 250. Ground ring 402, like ground rings 214 and 216, can maintain a ground potential and thereby operate as a Faraday cage, thereby providing electromagnetic shielding. Unlike ground rings 214 and 216, however, ground ring 402 provides substantial electromagnetic shielding for third and fourth pluralities of wirelessly enabled functional blocks 240 and 260, as well as for first and second pluralities of wirelessly enabled functional blocks 220 and 230. In an embodiment, ground ring 402 can acquire ground potential through one or more traces formed on PCB 250 (not shown).

As shown in FIG. 4, ground ring 402 is physically separated from substrate 204. As such, ground ring 402 does not exert additional stresses on substrate 204 when substrate 204 is bent or otherwise stressed. In an embodiment, ground ring 402 can be formed out of flexible materials to prevent cracking or damage to ground ring 402 when stresses are imposed.

Figure 5:
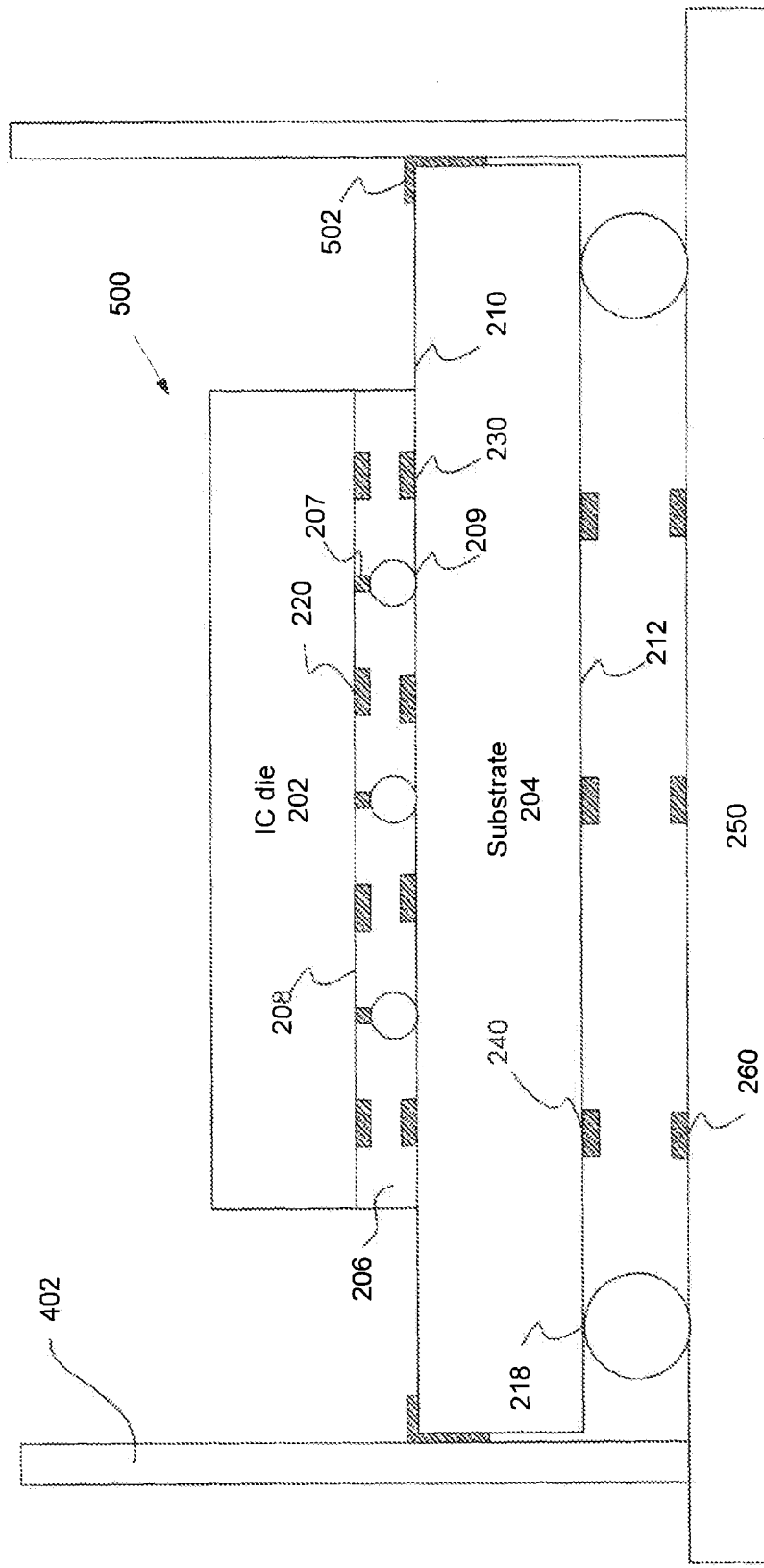

FIG. 5 shows a cross-sectional diagram of an IC device 500 coupled to PCB 250, according to an embodiment of the present invention. IC device 500 is substantially similar to IC device 400, except that IC device 500 additionally includes a coupling member 502. Coupling member 502 couples substrate 204 to ground ring 402. In an embodiment, coupling member 502 can be formed out of an electrically conductive material, e.g., copper. In a further embodiment, coupling member 502 electrically couples ground ring 402 to substrate 204. Thus, ground ring 402 can acquire a ground potential from substrate 204.

Moreover, coupling member 502 can be configured so as to allow for independent movement of substrate 204 and ground ring 402. For example, coupling member 502 can be formed out of a metal or other material that allows substrate 204 to slide with respect to ground ring 402. Thus, when IC device 500 is bent or otherwise stressed, coupling member 502 can be used ensure that ground ring 402 does not impose additional stresses on substrate 204. In a further embodiment, ground ring 402 can be made out of a flexible or malleable material to further reduce any stress it would impose on substrate 204.

Figure 6:
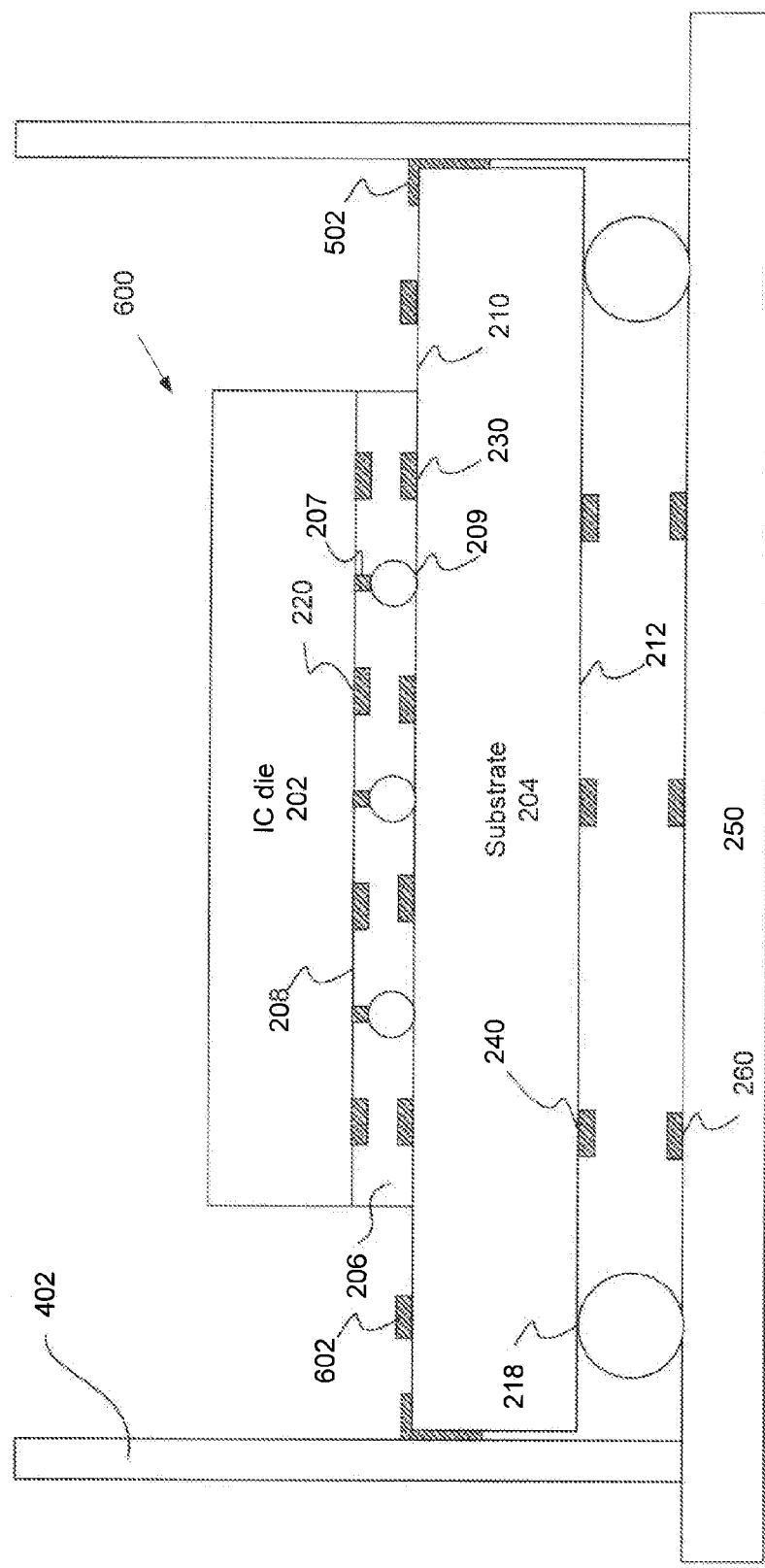

FIG. 6 shows a cross-sectional diagram of an IC device 600 coupled to PCB 250, according to an embodiment of the present invention. IC device 600 is substantially similar to IC device 500, except that IC device 600 additionally includes a second ground ring 602. Second ground ring 602 can be substantially similar to ground rings 214 and 216, described with reference to FIG. 2. Second ground ring 602 can provide additional shielding from electromagnetic interference. As would apparent to those skilled in the relevant arts, IC device 600 can include any number of ground rings similar to ground ring 602 without departing from the scope and spirit of the present invention.

Figure 7:
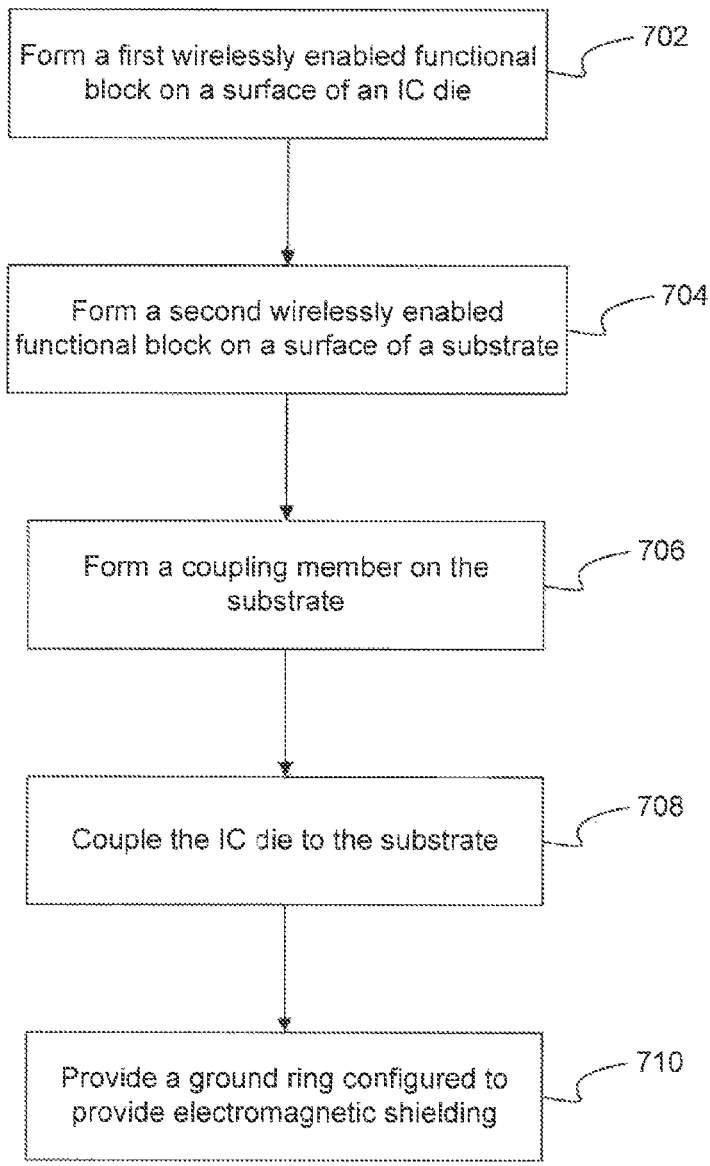
FIG. 7 is a flowchart of example steps for assembling an IC device, according to embodiments of the invention.

FIG. 7 shows a flowchart 700 providing example steps for assembling an IC device, according to an embodiment of the present invention. Other structural and operational embodiments will be apparent to persons skilled in the relevant art(s) based on the following discussion. The steps shown in FIG. 7 do not necessarily have to occur in the order shown. The steps of FIG. 7 are described in detail below.

In step 702, a first plurality of wirelessly enabled functional block is formed on a surface of an IC die. For example, in FIG. 2, first wirelessly enabled functional blocks 220 can be formed on surface 208 of IC die 202.

In step 704, a second wirelessly enabled functional block is formed on a surface of a substrate. For example, in FIG. 2, second plurality of wirelessly enabled functional blocks 230 can be formed on surface 210 of substrate 204. In a further embodiment, a third wirelessly enabled functional block can be formed on another surface of the substrate. For example, in FIG. 2, third plurality of wirelessly enabled functional blocks 240 can be formed on surface 212 of substrate 204. In an embodiment, one or more of the first, second, and third wirelessly enabled functional blocks can be formed a combination of traces and vias as described with reference to FIG. 3, above. Additional functionality can be provided by, for example, coupling the traces to a transceiver to form a wirelessly enabled functional block capable of performing signal processing among other tasks.

In optional step 706, a coupling member is formed on the substrate. For example, in FIG. 5, coupling member 502 can be formed on substrate 204. Coupling member 502 can be configured to couple substrate 204 to ground ring 402. In a further embodiment, coupling member 502 can be configured to allow substrate 204 to move independently of ground ring 402 by allowing substrate 204 to slide relative to ground ring 402.

In step 708, the IC die is coupled to the substrate. For example, in FIG. 2, IC die 202 is coupled to substrate 204 using adhesive 206.

In step 710, a ground ring configured to provide electromagnetic shielding is provided. For example, in FIG. 2, ground rings 214 and 216 are provided on substrate 204. In another embodiment, in FIG. 3, ground ring 402 is provided on PCB 250. As described above, ground rings 214, 216, and 402 are configured to provide electromagnetic shielding for ones of first, second, third, and fourth pluralities of wirelessly enabled functional blocks 220, 230, 240, and 260.

Conclusion

The embodiments of the invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An integrated circuit (IC) device, comprising:
   a substrate having first, second. and third surfaces, the first surface opposing the second surface and the third surface being orthogonal to the first surface;
   an IC die coupled to the first surface of the substrate;
   a first wirelessly enabled functional block located on the IC die;
   a second, wirelessly enabled functional block located on the first surface of the substrate, wherein the first wirelessly enabled functional block is configured to wirelessly communicate with the second wirelessly enabled functional block located on the substrate;
a ground ring configured to provide electromagnetic shielding for the first and second wirelessly enabled functional blocks; and
a coupling member attached to the third surface of the substrate and to the ground ring.

2. The IC device of claim 1, further comprising:
a second ground ring located on the first surface of the substrate.

3. The IC device of claim 2, wherein the second ground ring comprises a metal trace formed on the first surface of the substrate.

4. The IC device of claim 1, wherein the IC device is configured to be coupled to a printed circuit board (PCB) and wherein the ground ring is coupled to the PCB.

5. The IC device of claim 4, further comprising:
a second ground ring on the first surface of the substrate and a trace on the first surface of the substrate, wherein a thickness of the second ground ring is substantially equal to a thickness of the trace.

6. The IC device of claim 4, wherein the coupling member electrically couples the ground ring to the substrate.

7. The IC device of claim 6, wherein the substrate is capable of sliding with respect to the ground ring.

8. The IC device of claim 1, further comprising:
a printing circuit board (PCB), wherein the substrate is configured to be coupled to a surface of the (PCB);
a third wirelessly enabled functional block located on the second surface of the substrate; and
a fourth wirelessly enabled functional block located on the PCB, wherein the third wirelessly enabled functional block is configured to wirelessly communicate with the fourth wirelessly enabled functional block.

9. The IC device of claim 8, wherein the ground ring is configured to provide electromagnetic shielding for the third and fourth wirelessly enabled functional blocks.

10. The IC device of claim 8, further comprising a solder ball coupled to the second surface of the substrate that is configured to be coupled to the surface of the PCB.

11. The IC device of claim 1, wherein the first wirelessly enabled functional block comprises an antenna.

12. The IC device of claim 11, wherein the first wirelessly enabled functional block further comprises a transceiver.

13. The IC device of claim 1, further comprising:
a first plurality of wirelessly enabled functional blocks located on the IC die, the first plurality of wirelessly enabled functional blocks including the first wirelessly enabled functional block.

14. The IC device of claim 13, wherein each of the first plurality of wirelessly enabled functional blocks is configured to wirelessly communicate with a respective one of a second plurality of wirelessly enabled functional blocks located on the substrate and wherein the second plurality of wirelessly enabled functional blocks includes the second wirelessly enabled functional block.

15. The IC device of claim 14, wherein each of the first plurality of wirelessly enabled functional blocks is configured to use a multiple access technique.

16. The IC device of claim 1, further comprising:
a solder bump that electrically couples the IC die to the substrate.

17. The IC device of claim 1, further comprising:
a plurality of solder balls that electrically couple the substrate to a printed circuit board.

18. The IC device of claim 1, wherein the second wirelessly enabled functional block comprises an antenna and wherein the antenna comprises a trace.

19. The IC device of claim 1, wherein the coupling member is attached to the first surface of the substrate.

20. The IC device of claim 19, wherein the coupling member comprises copper.

* * * * *

UNITED STATES PATENT AND TRADEMARK OFFICE
CERTIFICATE OF CORRECTION

| | | |
|---|---|---|
| PATENT NO. | : 8,928,139 B2 | Page 1 of 1 |
| APPLICATION NO. | : 13/249885 | |
| DATED | : January 6, 2015 | |
| INVENTOR(S) | : Zhao et al. | |

It is certified that error appears in the above-identified patent and that said Letters Patent is hereby corrected as shown below:

On the Title page, item (57), line 4 please replace "block located, on the IC die" with --block located on the IC die--.

Signed and Sealed this
Sixteenth Day of February, 2016

Michelle K. Lee
*Director of the United States Patent and Trademark Office*